United States Patent
Lai et al.

(10) Patent No.: US 10,697,077 B1
(45) Date of Patent: Jun. 30, 2020

(54) ELECTROLYTIC COPPER FOIL

(71) Applicant: CHANG CHUN PETROCHEMICAL CO., LTD., Taipei (TW)

(72) Inventors: Chien-Ming Lai, Taipei (TW); Yao-Sheng Lai, Taipei (TW); Jui-Chang Chou, Taipei (TW)

(73) Assignee: CHANG CHUN PETROCHEMICAL CO., LTD., Taipei (TW)

( * ) Notice: Subject to any disclaimer, the term of this patent is extended or adjusted under 35 U.S.C. 154(b) by 0 days.

(21) Appl. No.: 16/550,175

(22) Filed: Aug. 24, 2019

(30) Foreign Application Priority Data

Apr. 19, 2019 (TW) .............................. 108113902 A

(51) Int. Cl.
| | | |
|---|---|---|
| *B21C 37/00* | (2006.01) | |
| *C25D 1/04* | (2006.01) | |
| *C22F 1/08* | (2006.01) | |
| *C25D 3/38* | (2006.01) | |
| *C25D 7/06* | (2006.01) | |
| *H01M 4/13* | (2010.01) | |

(Continued)

(52) U.S. Cl.
CPC .................. *C25D 1/04* (2013.01); *C22F 1/08* (2013.01); *C25D 3/38* (2013.01); *C25D 7/0614* (2013.01); *H01M 4/13* (2013.01); *H01M 10/0525* (2013.01); *H05K 1/09* (2013.01); *H05K 3/022* (2013.01); *H05K 2203/0134* (2013.01); *Y10T 428/12431* (2015.01)

(58) Field of Classification Search
None
See application file for complete search history.

(56) References Cited

U.S. PATENT DOCUMENTS 5,834,140 A * 11/1998 Wolski .................... C25D 1/04
429/220
8,722,199 B2    5/2014 Matsuda et al.
(Continued)

FOREIGN PATENT DOCUMENTS

| CN | 103210124 A | 7/2013 |
|---|---|---|
| JP | P2013-256712 A | 12/2013 |

(Continued)

*Primary Examiner* — Seth Dumbris
(74) *Attorney, Agent, or Firm* — Pai Patent & Trademark Law Firm; Chao-Chang David Pai

(57) ABSTRACT

Provided is an electrolytic copper foil. The electrolytic copper foil has a drum side and a deposited side, wherein $\Delta Rz$ is less than 0.8 μm; the electrolytic copper foil has a transverse direction, wherein the electrolytic copper foil is divided into 10 test pieces with the same width and the same length, and each two adjacent ones of the 10 test pieces have a weight deviation therebetween, and a count of the weight deviation(s) greater than or equal to 1.5% is smaller than a count of the weight deviations smaller than 1.5%; wherein n represents any one of the test piece numbers from 1 to 9, and the weight deviation between each two adjacent ones of the 10

$$\text{test pieces (\%)} = \frac{|\text{the weight of test piece } (n) - \text{the weight of test piece } (n+1)|}{\text{the smaller weight in test piece } (n) \text{ and test piece } (n+1)} \times 100\%.$$

11 Claims, 4 Drawing Sheets

(51) Int. Cl.
*H05K 1/09* (2006.01)
*H05K 3/02* (2006.01)
*H01M 10/0525* (2010.01)

(56) References Cited

U.S. PATENT DOCUMENTS

| | | | |
|---|---|---|---|
| 9,287,566 B1 * | 3/2016 | Chou | H01M 4/661 |
| 9,397,343 B1 * | 7/2016 | Cheng | C25D 1/04 |
| 10,424,793 B2 * | 9/2019 | Cheng | H01M 10/0525 |
| 2002/0155021 A1 * | 10/2002 | Nagai | B32B 15/08 |
| | | | 420/492 |
| 2004/0191560 A1 * | 9/2004 | Matsuda | C25D 5/16 |
| | | | 428/626 |
| 2007/0098910 A1 * | 5/2007 | Yamagata | C25D 1/04 |
| | | | 427/409 |
| 2010/0038115 A1 * | 2/2010 | Matsuda | C25D 5/48 |
| | | | 174/254 |
| 2012/0015206 A1 * | 1/2012 | Kim | B32B 15/01 |
| | | | 428/606 |
| 2014/0193660 A1 * | 7/2014 | Tsai | C25D 1/04 |
| | | | 428/606 |
| 2014/0342178 A1 * | 11/2014 | Saito | C25D 1/04 |
| | | | 428/606 |
| 2015/0267313 A1 | 9/2015 | Chou et al. | |

FOREIGN PATENT DOCUMENTS

| | | |
|---|---|---|
| JP | P2014-132106 A | 7/2014 |
| JP | 5588043 B2 | 9/2014 |
| JP | P2015-021186 A | 2/2015 |
| JP | P2016-204747 A | 12/2016 |
| JP | P2018-059202 A | 4/2018 |
| TW | 201810774 A | 3/2018 |
| TW | 201814085 A | 4/2018 |
| WO | 2017/082542 A1 | 5/2017 |

* cited by examiner

ELECTROLYTIC COPPER FOIL

CROSS-REFERENCE TO RELATED APPLICATION

Pursuant to 35 U.S.C. § 119(a), this application claims the benefit of the priority to Taiwan Patent Application No. 108113902 filed on Apr. 19, 2019. The content of the prior application is incorporated herein by its entirety.

BACKGROUND

1. Field of the Disclosure

The present disclosure relates to an electrolytic copper foil, more particular to an electrolytic copper foil for lithium ion batteries or printed circuit boards.

2. Description of the Prior Arts

Copper foils can be used as a material for electrically connecting various components of a circuit board and as a basic material of a copper-clad laminate, both of which are applied to the electronic industry in fields such as smart phones and notebook computers. In addition, copper foils also can be used as a material for electrodes of lithium-ion batteries (LiBs), which are applied to mobile electronic devices and electric vehicles (EVs).

The copper foils can be divided into a rolled copper foil and an electrolytic copper foil according to their preparation methods, which results in the obtained copper foils with different physical properties and application fields. The rolled copper foil with good mechanic properties has to undergo repeated rolling and annealing steps, resulting in high production cost and limited width of the obtained copper foil. By contrast, the electrolytic copper foil manufactured by a relatively simple process can utilize a roll to roll (RTR) process to implement a continuous mass production, so the electrolytic copper foil has the higher potential for industrial implementation.

In a roll to roll process, the electrolytic copper foil is wound into a cylindrical shape for continuous mass production. However, if the parameters or the winding manner of the conventional manufacturing method for electrolytic copper foil cannot be accurately controlled, the electrolytic copper foil will be slid on the guiding rolls during winding operation and cannot be wound along the winding direction, also called machine direction, of the innermost layer of the electrolytic copper foil. Therefore, the wound electrolytic copper foil will not completely overlap onto the previous layer of the electrolytic copper foil, and gradually causing a misalignment and winding into a trumpet-shaped product. Accordingly, it is necessary to cut off the misaligned and non-overlapped electrolytic copper foil in the manufacturing process. As a result, the production yield of the electrolytic copper foil will be lowered and the material will be wasted, resulting in a significant increase in the production cost of the electrolytic copper foil.

In order to eliminate and mitigate the misalignment, the conventional manufacturing methods have tried to modify manufacturing equipment, but increasing cost of the modification of the equipment still requires, so that the purpose of reducing the production cost of the electrolytic copper foil is difficult to achieve.

SUMMARY OF THE DISCLOSURE

In view that the conventional copper foil has technical defects, an objective of the instant disclosure is to effectively reduce or even avoid the misalignment during the winding process of the electrolytic copper foil, thereby improving a production yield thereof and avoiding an increase in production cost.

To achieve the foresaid objective, the instant disclosure provides an electrolytic copper foil comprising a drum side and a deposited side opposite the drum side. The drum side and the deposited side of the electrolytic copper foil each possess a surface roughness. An absolute value of a difference in surface roughness between the deposited side and the drum side is less than 0.8 μm. In addition, the electrolytic copper foil has a transverse direction (TD) and a machine direction (MD); the electrolytic copper foil is divided into 10 test pieces with the same width and the same length along the transverse direction, and each two adjacent ones of the 10 test pieces have a weight deviation therebetween, and a count of the weight deviation(s) greater than or equal to 1.5% is smaller than a count of the weight deviations smaller than 1.5%. The weight deviation between each two adjacent ones of the 10 test pieces is calculated by the following formula:

$$\text{the weight deviation between each two adjacent ones of the 10 test pieces (\%)} = \frac{|\text{the weight of test piece }(n) - \text{the weight of test piece }(n+1)|}{\text{the smaller weight in test piece }(n)\text{ and test piece }(n+1)} \times 100\%;$$

wherein n represents any one of the test piece numbers from 1 to 9.

By means of controlling the range of the absolute difference in surface roughness between the two opposite sides of the electrolytic copper foil (i.e. the deposited side and the drum side) and controlling the count of the significant weight deviation(s) between adjacent sub-region (i.e., the weight deviation between each two adjacent test pieces is greater than or equal to 1.5%) along the transverse direction, the two opposite sides of the electrolytic copper foil can respectively have similar contact force to a series of guiding rolls during the winding process. Therefore, the electrolytic copper foil can effectively reduce or even avoid the misalignment during winding. Consequently, a procedure of cutting off the misaligned electrolytic copper foil can be skipped in the manufacturing process, and the overall production yield will be improved.

An electrolytic copper foil is usually manufactured by supplying an electrolyte solution including copper ions between an anode and a cathode drum and applying a direct current between the anode and the cathode drum to make the copper ions of the electrolyte solution electrodeposited on the surface of the cathode drum. The electrolyte solution contains sulfuric acid and copper sulfate as main components, the anode is usually made from an insoluble metal and called dimensionally stable anode (DSA), and the cathode drum is a titanium-made drum having a polished surface. As the electrolytic copper foil accumulates to a predetermined thickness, the electrolytic copper foil is peeled off from the surface of the cathode drum and rolled up in a continuous process. One surface of the electrolytic copper foil which contacts the cathode drum is called the drum side, and the other surface of the electrolytic copper foil is called the deposited side.

In accordance with the instant disclosure, the surface roughness of the drum side and the deposited side of the electrolytic copper foil is expressed by a ten-point mean roughness (Rz) defined in JIS B 0601-1994. In addition, owing to controlling the absolute value of the difference in surface roughness between the deposited side and the drum side (i.e. ΔRz) to less than 0.8 μm, that is, ΔRz is equal to or larger than 0 μm and smaller than 0.8 μm, the electrolytic copper foil generates similar contact forces with the surfaces of a series of guiding rolls no matter which side of the electrolytic copper foil is brought into contact with the surfaces of a series of guiding rolls during winding. In some embodiments, ΔRz is equal to or larger than 0.1 μm and equal to or smaller than 0.75 μm.

In some embodiments, for the drum side, a Rz is equal to or larger than 0.2 μm and equal to or smaller than 15 μm, preferably equal to or larger than 0.5 μm and equal to or smaller than 10 μm, more preferably equal to or larger than 0.7 μm and equal to or smaller than 5 μm, most preferably equal to or larger than 1 μm and equal to or smaller than 2 μm; for the deposited side, a Rz is equal to or larger than 0.2 μm and equal to or smaller than 15 μm, preferably equal to or larger than 0.5 μm and equal to or smaller than 10 μm, more preferably equal to or larger than 0.7 μm and equal to or smaller than 5 μm, most preferably equal to or larger than 1 μm and equal to or smaller than 2 μm.

In accordance with the instant disclosure, the smaller the weight deviation between each two adjacent ones of the 10 test pieces is, the more uniform the thickness of each sub-region of the electrolytic copper foil along the transverse direction is, and the closer the weight of each sub-region of the electrolytic copper foil along the transverse direction is, so the contact force on the contact surface of the guiding rolls generated by the electrolytic copper foil is better-balanced. Therefore, the electrolytic copper foil can keep winding along the machine direction of the innermost layer of the electrolytic copper foil without sliding and misalignment. The transverse direction of the innermost layer of the electrolytic copper foil is perpendicular to the machine direction of the electrolytic copper foil.

In accordance with the instant disclosure, the electrolytic copper foil is divided into 10 test pieces with the same width and the same length along the transverse direction, so it will get 9 sets of data in total when calculating the weight deviation between each two adjacent ones of 10 test pieces. Preferably, a quotient of the count of the weight deviation(s) greater than or equal to 1.5% divided by 9 is smaller than or equal to 0.45. Moreover, in some embodiments, the weight deviation between each two adjacent ones of the 10 test pieces is equal to or greater than 0.00% and equal to or smaller than 2.20%.

In accordance with the instant disclosure, there is no particular limitation on the thickness of the electrolytic copper foil. Preferably, the electrolytic copper foil has a thickness of 1 μm to 210 μm. More preferably, the electrolytic copper foil has a thickness of 2 μm to 105 μm. Even more preferably, the electrolytic copper foil has a thickness of 3 μm to 35 μm. Most preferably, the electrolytic copper foil has a thickness of 4 μm to 20 μm.

In order to simultaneously control the range of the absolute difference in surface roughness of the both opposite sides of the electrolytic copper foil and the range of the relative weight deviations along the transverse direction of the electrolytic copper foil, it can be achieved by, for example, adjusting the composition or flow rate of the electrolyte solution, but it is not limited to the particular process as exemplified in the specification.

In general, in addition to sources of copper ions, other additives in the electrolyte solution may affect a current distribution between the anode and the cathode drum and a deposited thickness distribution of the electrolytic copper foil during the electrolysis, and thereby some properties of the electrolytic copper foil will be influenced. For example, when polyvinyl alcohol (PVA) is added into the electrolyte solution, the copper ions in the electrolyte solution may be controlled to deposit on peaks of the electrolytic copper foil, whereby the electrolytic copper foil possessing a small surface roughness will be obtained. Preferably, according to JIS K 6726, the testing method for PVA, the degree of saponification of PVA may range from 70 mole percent (mol %) to 100 mol %, and the degree of polymerization of PVA may range from 200 to 4000.

Usually, a flow rate of supplying the electrolyte solution may affect a concentration of copper ions in an electrolyzer, and the resulting characteristics of the electrolytic copper foil will be influenced. Under the condition that multiple pores are provided on a feed pipe for supplying the electrolyte solution, a ratio of pore distribution thereof may affect a flow rate of the electrolyte solution. The ratio of pore distribution is a ratio of a total area of all multiple pores to a cross sectional area of the feed pipe. For example, in the case of supplying same flow amount of the electrolyte solution, if the ratio of pore distribution is too low, the flow rate of the electrolyte solution will be too high, so the flow of the electrolyte solution will be disordered, which will affect the copper ions supplement between two electrodes. Conversely, if the ratio of pore distribution is too large, the distance between each two pores will be too close, which will affect the deposition of copper ions. Therefore, controlling the ratio of pore distribution is conducive to produce an electrolytic copper foil with a more uniform thickness which has smaller relative weight deviations along the transverse direction.

In order to improve the functions of the electrolytic copper foil such as anti-corrosion, a common surface treatment may be optionally and additionally performed on the electrolytic copper foil as needed; for example, the surface treatment on the electrolytic copper foil may include any one of a roughening treatment, a passivation treatment, an anti-corrosion treatment, and a silane coupling treatment or a combination thereof, but is not limited thereto.

In terms of the roughening treatment, at least one of the drum side and the deposited side of the electrolytic copper foil will have a surface with many fine undulations after roughening treatment. The surface with many fine undulations can provide a good adhesion to the stuck bodies concerned. The undulations have a spherical shape, a needle shape, or a plate shape, but it is not limited thereto. In addition, the electrolytic copper foil may be processed with a copper covering treatment following the roughening treatment, if necessary.

In terms of the passivation treatment, the passivation treatment may use zinc metal, zinc alloy, nickel metal, or nickel alloy, and the electrolytic copper foil will have improved chemical resistance.

In terms of the anti-corrosion treatment, the anti-corrosion treatment may be an organic anti-corrosion treatment or an inorganic anti-corrosion treatment. Specifically, the organic anti-corrosion treatment could use an azole compound, and the inorganic anti-corrosion treatment could use a chromate; therefore, an inorganic anti-corrosion layer or an organic anti-corrosion layer is formed on at least one of the drum side and the deposited side of the electrolytic copper foil. Anti-corrosion components such as the azole compound or the chromate would be attached to the surface of the electrolytic copper foil by the method of dip coating, spraying, plating or the like, but it is not limited thereto.

Examples of the azole compound include a triazole-based compound such as triazole, benzotriazole, tolyltriazole, carboxybenzotriazole, chloro-substituted benzotriazole, 3-amino-1,2,4-triazole, 4-amino-1,2,4-triazole, or the derivatives thereof; a thiazole-based compound such as thiazole, isothiazole, 2-amino-4-methylthiazole, or the derivatives thereof; or an imidazole-based compound such as imidazole, 2-mercapto-1-methylimidazole, 1-(2-hydroxyethyl)-2-methylimidazole, 1-(2-chloroethyl)-2-methylimidazole, 2-aminobenzimidazole, or the derivatives thereof. The organic anti-corrosion treatment can use at least one of the foresaid azole compounds.

In terms of the silane coupling treatment, the silane coupling treatment adopts a silane coupling agent to treat the surface of the electrolytic copper foil. Therefore, a silane coupling layer is formed on at least one of the drum side and the deposited side of the electrolytic copper foil. The silane coupling agent may include, but is not limited to, a compound represented by the chemical formula: $Y—(R')_n—Si(OR)_3$; wherein Y is selected from the group consisting of: a glycidyl group (i.e. epoxy group), an amino group, an epoxycyclohexyl group, an uramino group (i.e. carbamido group, $H_2NCONH—$), a carbamate group, a malonic ester group, a carboxyl group, a mercapto group, a cyano group, an acetoxy group, an acryloxy group, a methylacryloxy group, a chloromethylphenyl group, a pyridyl group, a vinyl group, a dialkylamino group, a phenylalkylamino group, and an imidazolyl group; wherein n is an integer 0 or 1; wherein R' is selected from the group consisting of: a methylene group, an ethylene group, a propylene group, and a phenylene group substituted with an ethyl or a propyl group, wherein the phenylene group is bonded to Y; and wherein R is selected from the group consisting of: a methyl group, an ethyl group, and a linear or branched C3 to C6 alkyl group. Specifically, the silane coupling agent can be an epoxy-based silane, an amino-based silane, a methacryloxy-based silane, a vinyl-based silane, or a mercapto-based silane. The silane coupling treatment can be carried out by using one or more silane coupling agents.

In accordance with the instant disclosure, there is no particular limitation on the field to which the electrolytic copper foil is applied. The electrolytic copper foil may be applied to an electrode of a lithium ion battery, and an electronic device comprising the lithium ion battery made with the same, such as a mobile power, a smart phone, a notebook computer, an electric vehicle, or the like. The electrolytic copper foil may also be applied to the field of printed circuit boards such as a rigid copper foil substrate, a flexible copper foil substrate, or IC substrate, but it is not limited thereto.

Other objectives, advantages and novel features of the disclosure will become more apparent from the following detailed description when taken in conjunction with the accompanying drawings.

DETAILED DESCRIPTION OF THE DISCLOSURE

Hereinafter, one skilled in the art can easily realize the advantages and effects of the instant disclosure from the following examples. Therefore, it should be understood that the descriptions proposed herein are just preferable examples for the purpose of illustrations only, not intended to limit the scope of the disclosure. Various modifications and variations could be made in order to practice or apply the instant disclosure without departing from the spirit and scope of the disclosure.

The Instrument Model Used in the Following Examples:

1. α-type surface roughness measuring instrument: SE 1700 manufactured by Kosaka Laboratory; and
2. microbalance: AG-204 manufactured by Mettler Toledo International Inc.

Electrolytic Copper Foil of Example 1

Preparation of a Copper Sulfate Electrolyte Solution for an Electrolytic Bath:

A copper wire was dissolved in a 50 wt % of sulfuric acid aqueous solution to prepare an essential solution including copper sulfate ($CuSO_4.5H_2O$) and sulfuric acid. In the essential solution, a concentration of copper sulfate was 320 g/liter (g/L) and a concentration of sulfuric acid was 100 g/L. Then, 5 mg of PVA (i.e. 5 ppm of PVA), 5 mg of hydroxyethyl cellulose (HEC, purchased from DAICEL Corporation) and 3 mg of sodium 3-mercapto-1-propanesulphonate (MPS, purchased from HOPAX Fine Chemicals) were added in each liter of the essential solution to form the copper sulfate electrolyte solution for the electrolytic bath.

Figure 1A:
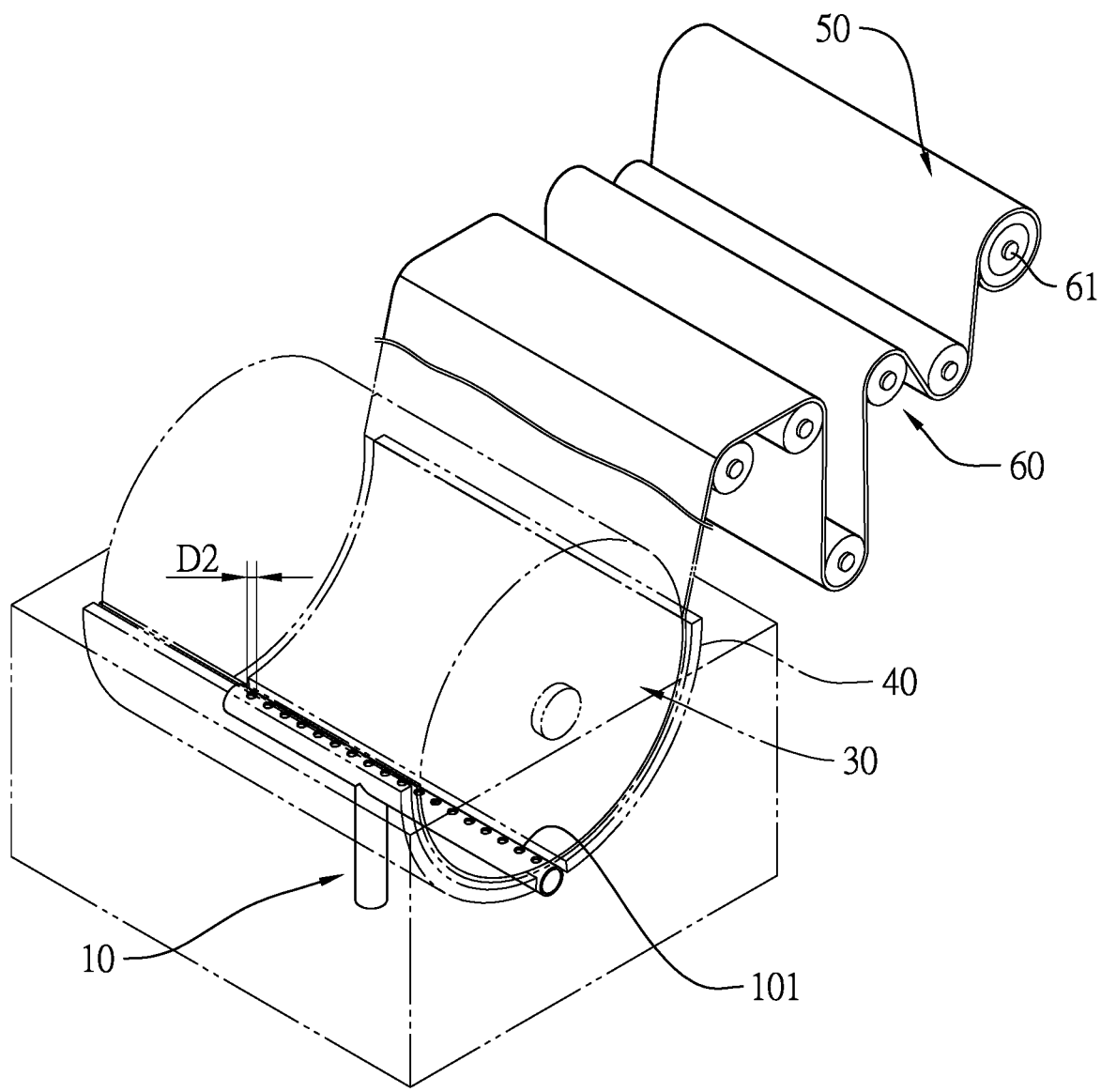
FIG. 1A is a schematic perspective view of making an electrolytic copper foil of the instant disclosure.
Figure 1B:
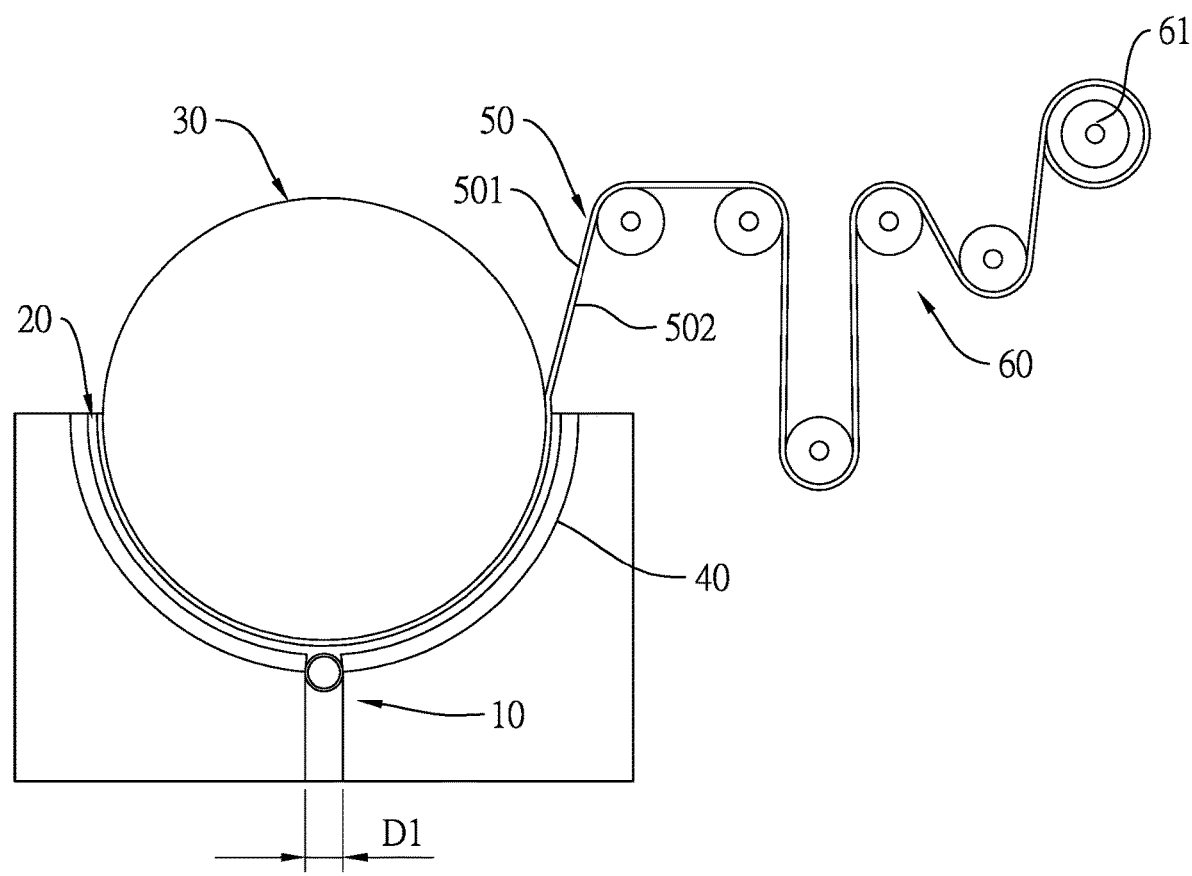
FIG. 1B is a schematic side view of making the electrolytic copper foil of the instant disclosure.

With reference to FIGS. 1A and 1B, a T-shaped feed pipe 10 had a diameter D1 of 3 inches. In the electrolytic bath set at 50° C., the aforesaid copper sulfate electrolyte solution 20 was continuously supplied via the feed pipe 10. A horizontal tube of the feed pipe 10 which was parallel to the transverse direction of the electrolytic copper foil 50 had one hundred pores 101 on its surface. The length of the horizontal tube of the feed pipe 10 was 1390 mm, and a pore size D2 of each pore 101 was 7 mm. Each two adjacent pores 101 had a same distance therebetween. Overall, the ratio of pore distribution of the feed pipe 10 was 84.39%. A current with a current density of 40 $A/dm^2$ flowed between the cathode drum 30 and the anode plate 40 which was disposed along the curved surface of the cathode drum 30. Therefore, copper ions included in the copper sulfate electrolyte solution 20 were electrodeposited on the curved surface of the cathode drum 30 to form the electrolytic copper foil 50. Subsequently, the electrolytic copper foil 50 was peeled off from the cathode drum 30 and continuously rolled by a series of guiding rolls 60 and finally rolled up on a take-up roll 61. The electrolytic copper foil 50 had a transverse width of 1380 mm and a thickness of 8 μm. The electrolytic copper foil 50 had a drum side 501 and a deposited side 502 opposite the drum side 501.

In some cases, the electrolytic copper foil 50 might be subsequently treated by a surface treatment, such as a roughening treatment, a passivation treatment, an anti-corrosion treatment, and a silane coupling treatment, or a combination thereof. The anti-corrosion treatment might be performed by an electric plating with a chromate solution at a temperature of 31.5° C. The chromate solution comprised chromic acid with a concentration of 1.5 g/L. A current used in the electric plating had a current density of 0.5 A/dm². After completion of the treatment, the drum side 501 and the deposited side 502 each respectively had an inorganic anti-corrosion layer comprising chromates.

Electrolytic Copper Foil of Example 2

The process used to manufacture the electrolytic copper foil of Example 2 was similar to the process used to manufacture the electrolytic copper foil of Example 1. The differences between the processes were that the feed pipe with 100 pores whose size was 7 mm used in Example 1 was replaced with the feed pipe with 80 pores whose size was 6.7 mm, and the ratio of pore distribution of the feed pipe used in Example 2 was 61.85%.

Electrolytic Copper Foil of Example 3

The process used to manufacture the electrolytic copper foil of Example 3 was similar to the process used to manufacture the electrolytic copper foil of Example 1. The differences between the processes were that the feed pipe with 100 pores whose size was 7 mm used in Example 1 was replaced with the feed pipe with 115 pores whose size was 6.7 mm, and the ratio of pore distribution of the feed pipe used in Example 3 was 88.91%.

Electrolytic Copper Foil of Example 4

The process used to manufacture the electrolytic copper foil of Example 4 was similar to the process used to manufacture the electrolytic copper foil of Example 3. The differences between the processes were that the copper sulfate electrolyte solution containing 5 ppm of PVA used in Example 3 was replaced with the copper sulfate electrolyte solution containing 2.5 ppm of PVA.

Electrolytic Copper Foil of Example 5

The process used to manufacture the electrolytic copper foil of Example 5 was similar to the process used to manufacture the electrolytic copper foil of Example 3. The differences between the processes were that the copper sulfate electrolyte solution containing 5 ppm of PVA used in Example 3 was replaced with the copper sulfate electrolyte solution containing 7.5 ppm of PVA.

Electrolytic Copper Foil of Example 6

The process used to manufacture the electrolytic copper foil of Example 6 was similar to the process used to manufacture the electrolytic copper foil of Example 1. The differences between the processes were that the copper sulfate electrolyte solution containing 5 ppm of PVA used in Example 1 was replaced with the copper sulfate electrolyte solution containing 2.5 ppm of PVA. In addition, the cathode drum used in Example 1 was changed to another cathode drum with a different width so that the obtained electrolytic copper foil of Example 6 had a transverse width of 400 mm and a thickness of 8 μm.

Electrolytic Copper Foil of Example 7

The process used to manufacture the electrolytic copper foil of Example 7 was similar to the process used to manufacture the electrolytic copper foil of Example 1. The differences between the processes were that the copper sulfate electrolyte solution containing 5 ppm of PVA used in Example 1 was replaced with the copper sulfate electrolyte solution containing 5.5 ppm of PVA.

Electrolytic Copper Foil of Comparative Example 1

The process used to manufacture the electrolytic copper foil of Comparative Example 1 was similar to the process used to manufacture the electrolytic copper foil of Example 1. The differences between the processes were that the feed pipe with 100 pores whose size was 7 mm used in Example 1 was replaced with the feed pipe with 100 pores whose size was 5.0 mm, and the ratio of pore distribution of the feed pipe used in Comparative Example 1 was 43.06%.

Electrolytic Copper Foil of Comparative Example 2

The process used to manufacture the electrolytic copper foil of Comparative Example 2 was similar to the process used to manufacture the electrolytic copper foil of Example 1. The differences between the processes were that the feed pipe with 100 pores whose size was 7 mm used in Example 1 was replaced with the feed pipe with 100 pores whose size was 10 mm, and the ratio of pore distribution of the feed pipe used in Comparative Example 2 was 172.22%.

Electrolytic Copper Foil of Comparative Example 3

The process used to manufacture the electrolytic copper foil of Comparative Example 3 was similar to the process used to manufacture the electrolytic copper foil of Example 1. The differences between the processes were that the copper sulfate electrolyte solution containing 5 ppm of PVA used in Example 1 was replaced with the copper sulfate electrolyte solution free of PVA.

Electrolytic Copper Foil of Comparative Example 4

The process used to manufacture the electrolytic copper foil of Comparative Example 4 was similar to the process used to manufacture the electrolytic copper foil of Example 1. The differences between the processes were that the copper sulfate electrolyte solution containing 5 ppm of PVA used in Example 1 was replaced with the copper sulfate electrolyte solution containing 10 ppm of PVA.

Electrolytic Copper Foil of Comparative Example 5

The process used to manufacture the electrolytic copper foil of Comparative Example 5 was similar to the process used to manufacture the electrolytic copper foil of Example 1. The differences between the processes were that the feed pipe with 100 pores whose size was 7 mm used in Example 1 was replaced with the feed pipe with 150 pores whose size was 6.7 mm, and the ratio of pore distribution of the feed pipe used in Comparative Example 5 was 115.97%.

Electrolytic Copper Foil of Comparative Example 6

The process used to manufacture the electrolytic copper foil of Comparative Example 6 was similar to the process used to manufacture the electrolytic copper foil of Comparative Example 3. The differences between the processes were that the feed pipe with 100 pores whose size was 7 mm used in Comparative Example 3 was replaced with the feed pipe with 115 pores whose size was 6.7 mm, and the ratio of pore distribution of the feed pipe used in Comparative Example 6 was 88.91%.

Electrolytic Copper Foil of Comparative Example 7

The process used to manufacture the electrolytic copper foil of Comparative Example 7 was similar to the process used to manufacture the electrolytic copper foil of Comparative Example 2. The differences between the processes were that the copper sulfate electrolyte solution containing 5 ppm of PVA used in Comparative Example 2 was replaced with the copper sulfate electrolyte solution containing 10 ppm of PVA.

Electrolytic Copper Foil of Comparative Example 8

The process used to manufacture the electrolytic copper foil of Comparative Example 8 was similar to the process used to manufacture the electrolytic copper foil of Comparative Example 7. The differences between the processes were that the copper sulfate electrolyte solution containing 10 ppm of PVA used in Comparative Example 7 was replaced with the copper sulfate electrolyte solution containing 7.5 ppm of PVA. In addition, the cathode drum used in Comparative Example 8 was changed to another cathode drum with a different width so that the obtained electrolytic copper foil of Comparative Example 8 had a transverse width of 400 mm and a thickness of 8 μm.

Analysis 1: Analyzing the Statistical Standard Deviation of the Weight of the Electrolytic Copper Foils Each of the electrolytic copper foils of Examples 1 to 7 (expressed as E1 to E7) and Comparative Examples 1 to 8 (expressed as C1 to C8) was cut into a sample of 10 cm in length along the machine direction, and each sample of Examples 1 to 7 and Comparative Examples 1 to 8 was divided into 10 test pieces with the same width along the transverse direction. Therefore, each test piece had the same width and the same length (10 cm). Each test piece was weighed by the microbalance, and then a standard deviation in statistics represented by a three sigma (3σ) between the weight values of the 10 test pieces was calculated in each of Examples 1 to 7 and Comparative Examples 1 to 8. The 3σ values of Examples 1 to 7 and Comparative Examples 1 to 8 were shown in Table 1-1.

TABLE 1-1

3σ values of Examples 1 to 7 and Comparative Examples 1 to 8

| Example No. | E1 | E2 | E3 | E4 | E5 | E6 | E7 |     |
|---|---|---|---|---|---|---|---|---|
| 3σ (%) | 1.5 | 2.78 | 1.24 | 2.64 | 2.25 | 2.14 | 2.47 |     |
| Example No. | C1 | C2 | C3 | C4 | C5 | C6 | C7 | C8 |
| 3σ (%) | 2.46 | 2.43 | 2.24 | 1.97 | 2.69 | 2.49 | 2.44 | 2.78 |

Analysis 2: Analyzing the Statistical Relative Range of the Weight of the Electrolytic Copper Foils Each of the electrolytic copper foils of Examples 1 to 7 and Comparative Examples 1 to 8 was cut into a sample of 10 cm in length along the machine direction, and each sample of Examples 1 to 7 and Comparative Examples 1 to 8 was divided into 10 test pieces with the same width along the transverse direction. Therefore, each test piece had the same width and the same length (10 cm). Each test piece was weighed by the microbalance, and then a relative range for the weight values of the 10 test pieces was calculated in each of Examples 1 to 7 and Comparative Examples 1 to 8. The relative range was calculated by the following formula. The relative ranges of Examples 1 to 7 and Comparative Examples 1 to 8 were shown in Table 1-2.

The relative range for the weight values of 10 test pieces (%) =

$$\frac{|\text{the maximum weight} - \text{the minimum weight}|}{\text{the average weight of 10 test pieces}} \times 100\%.$$

TABLE 1-2

Relative range of Examples 1 to 7 and Comparative Examples 1 to 8

| Example No. | E1 | E2 | E3 | E4 | E5 | E6 | E7 |     |
|---|---|---|---|---|---|---|---|---|
| Relative range (%) | 1.56 | 2.30 | 1.37 | 2.06 | 2.07 | 1.82 | 2.58 |     |
| Example No. | C1 | C2 | C3 | C4 | C5 | C6 | C7 | C8 |
| Relative range (%) | 2.10 | 1.91 | 2.11 | 1.80 | 2.33 | 2.32 | 2.40 | 2.86 |

Analysis 3: Analyzing the Weight Deviation Between Each Two Adjacent Ones of the 10 Test Pieces of the Electrolytic Copper Foils Each of the electrolytic copper foils of Examples 1 to 7 and Comparative Examples 1 to 8 was cut into a sample of 10 cm in length along the machine direction, and each sample of Examples 1 to 7 and Comparative Examples 1 to 8 was divided into 10 test pieces with the same width along the transverse direction. Therefore, each test piece had the same width and the same length (10 cm). Each test piece was weighed by the microbalance, and then a weight deviation between each two adjacent ones of the 10 test pieces was calculated by the following formula.

The weight deviation between each two adjacent ones of the 10 test pieces (%) = $\frac{|\text{the weight of test piece } (n) - \text{the weight of test piece } (n+1)|}{\text{the smaller weight in test piece } (n) \text{ and test piece } (n+1)} \times 100\%;$ wherein n represents any one of the test piece numbers from 1 to 9.

When calculating the weight deviation between each two adjacent ones of the 10 test pieces, it obtained 9 sets of data in each of Examples 1 to 7 and Comparative Examples 1 to 8. The obtained data were shown in Table 2. In addition, a counting was performed to figure out how many sets of the weight deviations were greater than or equal to 1.5% among the 9 sets of data. The counts of each of Examples 1 to 7 and Comparative Examples 1 to 8 were shown in Table 2. Moreover, a quotient of the count of the weight deviation(s) greater than or equal to 1.5% divided by 9 was calculated and listed in Table 3.

As listed in Table 2, the count of the weight deviation(s) greater than or equal to 1.5% was abbreviated to "count of ≥1.5%".

TABLE 2 analytical results of the weight deviations between each set of test pieces (n) and (n + 1) of Examples 1 to 7 and Comparative Examples 1 to 8

| | Weight deviation between test pieces (n) and (n + 1) (%) | | | | | | | | | Count that |
|---|---|---|---|---|---|---|---|---|---|---|
| n | 1 | 2 | 3 | 4 | 5 | 6 | 7 | 8 | 9 | weight deviation |
| n + 1 | 2 | 3 | 4 | 5 | 6 | 7 | 8 | 9 | 10 | ≥1.5% |
| E1 | 1.03 | 0.51 | 0.13 | 0.36 | 0.45 | 0.31 | 0.92 | 1.57 | 0.51 | 1 |
| E2 | 1.59 | 0.34 | 0.27 | 1.62 | 1.67 | 0.44 | 2.14 | 0.18 | 0.12 | 4 |
| E3 | 0.27 | 0.41 | 0.45 | 0.84 | 0.75 | 0.32 | 0.29 | 0.09 | 0.08 | 0 |
| E4 | 0.18 | 0.02 | 2.05 | 0.27 | 0.09 | 1.31 | 0.86 | 0.79 | 1.84 | 2 |

TABLE 2-continued analytical results of the weight deviations between each set of test pieces (n) and (n + 1) of Examples 1 to 7 and Comparative Examples 1 to 8

| | Weight deviation between test pieces (n) and (n + 1) (%) | | | | | | | | | Count that |
|---|---|---|---|---|---|---|---|---|---|---|
| n | 1 | 2 | 3 | 4 | 5 | 6 | 7 | 8 | 9 | weight deviation |
| n + 1 | 2 | 3 | 4 | 5 | 6 | 7 | 8 | 9 | 10 | ≥1.5% |
| E5 | 0.53 | 0.51 | 0.82 | 2.09 | 1.01 | 0.35 | 0.41 | 0.06 | 1.73 | 2 |
| E6 | 1.02 | 0.91 | 0.07 | 0.82 | 0.48 | 1.36 | 0.22 | 1.83 | 0.07 | 1 |
| E7 | 0.54 | 0.51 | 0.04 | 0.94 | 0.55 | 0.07 | 0.38 | 0.78 | 1.74 | 1 |
| C1 | 0.03 | 1.60 | 0.46 | 1.66 | 0.38 | 0.03 | 1.59 | 1.81 | 1.59 | 5 |
| C2 | 1.58 | 1.05 | 0.51 | 1.53 | 1.71 | 1.64 | 1.82 | 1.54 | 1.53 | 7 |
| C3 | 2.10 | 0.19 | 0.68 | 0.02 | 0.05 | 0.01 | 0.95 | 1.29 | 1.55 | 2 |
| C4 | 0.97 | 1.62 | 1.13 | 0.43 | 0.89 | 0.05 | 0.32 | 1.09 | 0.00 | 1 |
| C5 | 1.65 | 0.09 | 0.20 | 1.02 | 1.86 | 0.25 | 1.67 | 2.08 | 2.20 | 5 |
| C6 | 1.19 | 0.21 | 1.08 | 0.74 | 0.71 | 0.59 | 1.56 | 1.90 | 2.16 | 3 |
| C7 | 1.58 | 2.00 | 0.86 | 1.55 | 1.64 | 1.53 | 1.52 | 0.23 | 0.29 | 6 |
| C8 | 0.41 | 1.93 | 1.62 | 0.46 | 1.64 | 0.95 | 0.20 | 2.14 | 1.68 | 5 |

Analysis 4: Analyzing the Surface Roughness of the Electrolytic Copper Foils

According to the standard JIS B 0601-1994, the electrolytic copper foils of Examples 1 to 7 and Comparative Examples 1 to 8 were analyzed for the surface roughness of the drum sides and the deposited sides of the electrolytic copper foils by using the α-type surface roughness measuring instrument. The surface roughness of the instant disclosure was represented by ten-point mean roughness. Rz of the drum sides and the deposited sides of the electrolytic copper foils of Examples 1 to 7 and Comparative Examples 1 to 8 was shown in Table 3.

Moreover, an absolute value of a difference in surface roughness between the deposited side and the drum side of the electrolytic copper foils of Examples 1 to 7 and Comparative Examples 1 was respectively calculated by the following formula and listed in Table 3.

$$\Delta Rz = |Rz(\text{the drum side}) - Rz(\text{the deposited side})|.$$

Analysis 5: Analyzing the Misalignment Degree of the Electrolytic Copper Foils During the Winding Process of the Electrolytic Copper Foils In the roll-to-roll process set with a tension of 55 kg, each of the electrolytic copper foils of Examples 1 to 7 and Comparative Examples 1 to 8 was wound by a take-up roll of a diameter of 220 mm at a rolling speed of 8 meters/min.

With reference to FIGS. 2A, 2B, 3A and 3B, the innermost layer of the electrolytic copper foil 50 on the take-up roll 61 had two endpoints A and B, and a distance between endpoints A and B was a transverse width W of the electrolytic copper foil 50. The rolling process was stopped when the length of the electrolytic copper foil 50 wound up on the take-up roll 61 reached 1000 meters. Then, the outermost layer of the electrolytic copper foil 50 on the take-up roll 61 had two endpoints A' and B', and a distance between endpoints A' and B' was also the transverse width W of the electrolytic copper foil 50.

A distance between endpoints A and A' was measured and defined as a misaligned length L of the electrolytic copper foil of Examples 1 to 7 and Comparative Examples 1 to 8.

A misalignment ratio was defined as a ratio of the misaligned length L divided by the transverse width W of the electrolytic copper foil 50.

The misaligned lengths and the misalignment ratios of the electrolytic copper foil of Examples 1 to 7 and Comparative Examples 1 to 8 were shown in Table 3.

As listed in Table 3, the quotient of the count of the weight deviation(s) greater than or equal to 1.5% divided by 9 was abbreviated to "ratio of the weight deviation(s)".

TABLE 3 ratio of the weight deviation, Rz of the drum side and deposited side, ΔRz, L, and misalignment ratios of the electrolytic copper foil of Examples 1 to 7 and Comparative Examples 1 to 8

| | Ratio of the weight deviation(s) | Rz of the drum side (μm) | Rz of the deposited side (μm) | ΔRz (μm) | L (mm) | Misalignment ratio (%) |
|---|---|---|---|---|---|---|
| E1 | 0.11 | 1.02 | 1.29 | 0.27 | 0 | 0 |
| E2 | 0.44 | 1.09 | 1.39 | 0.30 | 0 | 0 |
| E3 | 0 | 1.01 | 1.27 | 0.26 | 0 | 0 |
| E4 | 0.22 | 1.07 | 1.81 | 0.74 | 0 | 0 |
| E5 | 0.22 | 1.09 | 1.70 | 0.61 | 0 | 0 |
| E6 | 0.11 | 1.05 | 1.55 | 0.50 | 0 | 0 |
| E7 | 0.11 | 1.08 | 1.08 | 0.00 | 0 | 0 |
| C1 | 0.56 | 1.09 | 1.53 | 0.44 | 87 | 6.3 |
| C2 | 0.78 | 1.06 | 1.57 | 0.51 | 205 | 14.9 |
| C3 | 0.22 | 1.07 | 2.02 | 0.95 | 26 | 1.9 |
| C4 | 0.11 | 1.04 | 2.13 | 1.09 | 46 | 3.3 |
| C5 | 0.56 | 1.08 | 1.45 | 0.37 | 102 | 7.4 |
| C6 | 0.33 | 1.02 | 1.89 | 0.87 | 37 | 2.7 |
| C7 | 0.67 | 1.06 | 1.97 | 0.91 | 185 | 13.4 |
| C8 | 0.56 | 1.08 | 1.75 | 0.67 | 30 | 7.5 |

Discussion of the Results

As shown in Table 1-1, from the analytical results of the statistical standard deviation of the weight of the electrolytic copper foils of Examples 1 to 7 and Comparative Examples 1 to 8, it is not distinguishable whether the electrolytic copper foils of Examples 1 to 7 and Comparative Examples 1 to 8 are prone to misalignment. For example, as shown in Table 1-1, the 3σ value of Comparative Example 4 is smaller than the 3σ values of Examples 2, 4, and 5 to 7. However, from the results of the misalignment ratio in winding tests in Table 3, it is found that the electrolytic copper foil of Comparative Example 4 still incurs a misalignment during the winding process of the electrolytic copper foil. In addition, as shown in Table 1-2, from the analytical results of the statistical relative range of the weight of the electrolytic copper foils of Examples 1 to 7 and Comparative Examples 1 to 8, it is also not distinguishable whether the electrolytic copper foils of Examples 1 to 7 and Comparative Examples 1 to 8 are prone to misalignment. For example, as shown in Table 1-2, the relative ranges of Comparative Examples 2 and 4 are smaller than the relative ranges of Examples 2, 4, 5 and 7. However, from the results of the misalignment ratio in winding tests in Table 3, it is found that both the electrolytic copper foils of Comparative Examples 2 and 4 still respectively have a misalignment during the winding process. It can be seen that even if the weight of the electrolytic copper foil is controlled within an appropriate range of the standard deviation or within a relatively small range of the relative range, the poor production efficiency of manufacturing the electrolytic copper foil cannot be solved.

As shown in Table 2, from the comparison results of Examples 1 to 7 and Comparative Examples 1 to 8, the counts of the weight deviation(s) greater than or equal to 1.5% of each electrolytic copper foil of Examples 1 to 7 are smaller than or equal to 4. That is, the count of the weight deviation(s) greater than or equal to 1.5% is smaller than the count of the weight deviations smaller than 1.5%. In contrast, the counts of the weight deviations greater than or equal to 1.5% of each electrolytic copper foil of Comparative Examples 1, 2, 5, 7 and 8 are larger than or equal to 5. That is, the count of the weight deviation(s) greater than or equal to 1.5% is larger than a count of the weight deviations smaller than 1.5% in Comparative Examples 1, 2, 5, 7 and 8.

Figure 2A:
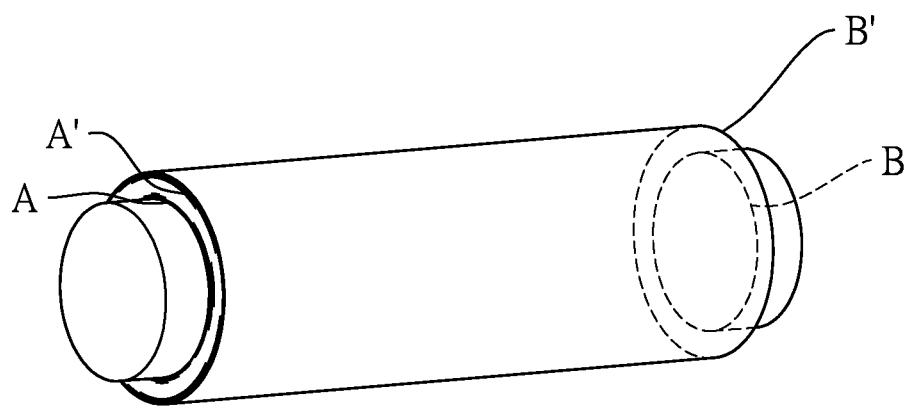
FIG. 2A is a schematic view showing that the electrolytic copper foil of Examples is wound on the take-up roll at the terminal state.
Figure 2B:
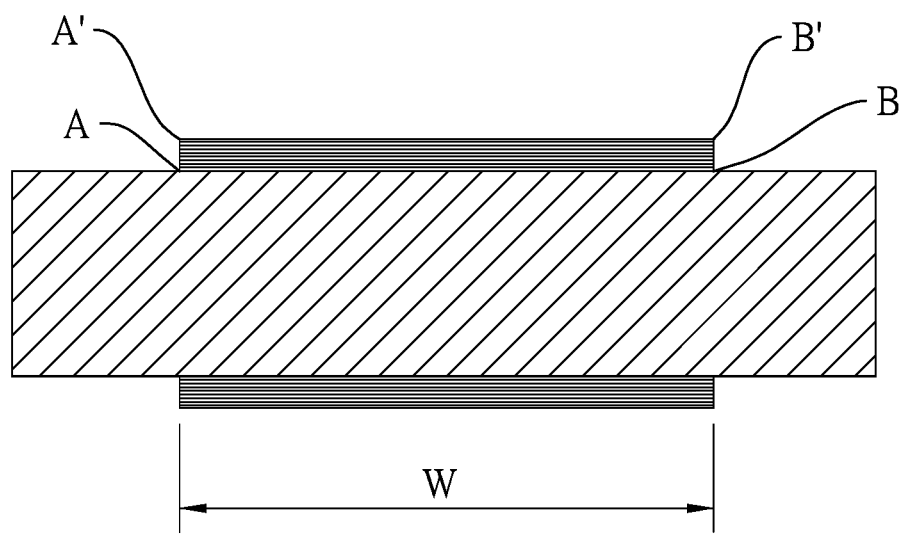
FIG. 2B is a sectional view of FIG. 2A.

Since each of the electrolytic copper foils of Examples 1 to 7 has the absolute difference in surface roughness between the drum side and deposited side within an appropriate range and each of the electrolytic copper foils is divided into 10 test pieces with the same area along the transverse direction and the counts of the weight deviation(s) between each two adjacent ones of the 10 test pieces are controlled at greater than or equal to 1.5% within an appropriate range, the both sides of the electrolytic copper foils of Examples 1 to 7 can respectively apply similar contact forces to a series of guiding rolls during the winding process. Therefore, it demonstrates that the electrolytic copper foil of the instant disclosure can reduce, even avoid misalignment during the transportation in the roll-to-roll process. Even for the electrolytic copper foil having a wider transverse width such as Examples 1 to 5 and 7 or the electrolytic copper foil having a narrower transverse width such as Example 6, all of them can avoid incurring a misalignment as shown in FIGS. 2A and 2B, in which the endpoints of the outermost layer A' and B' respectively overlap the endpoints of the innermost layer A and B. As a result, the yield of manufacturing the electrolytic copper foil can be increased, and then the production cost will be reduced.

Moreover, as the ΔRz of the electrolytic copper foils of Examples 1 to 7 shown in Table 3, even if there is no difference in surface roughness between the deposited side and the drum side of the electrolytic copper foil such as Example 7, as long as the relative weight deviation of the electrolytic copper foil along the transverse direction is controlled in the range defined by the present disclosure, the electrolytic copper foil can avoid incurring the misalignment during the winding process.

Figure 3A:
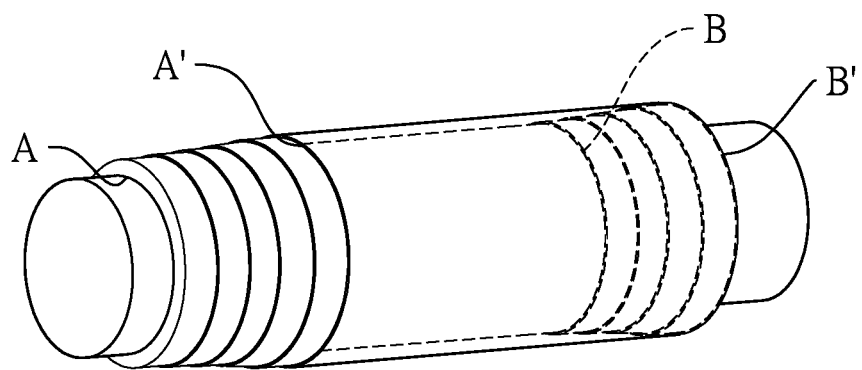
FIG. 3A is a schematic view showing that the electrolytic copper foil of Comparative Examples is wound on the take-up roll at the terminal state.
Figure 3B:
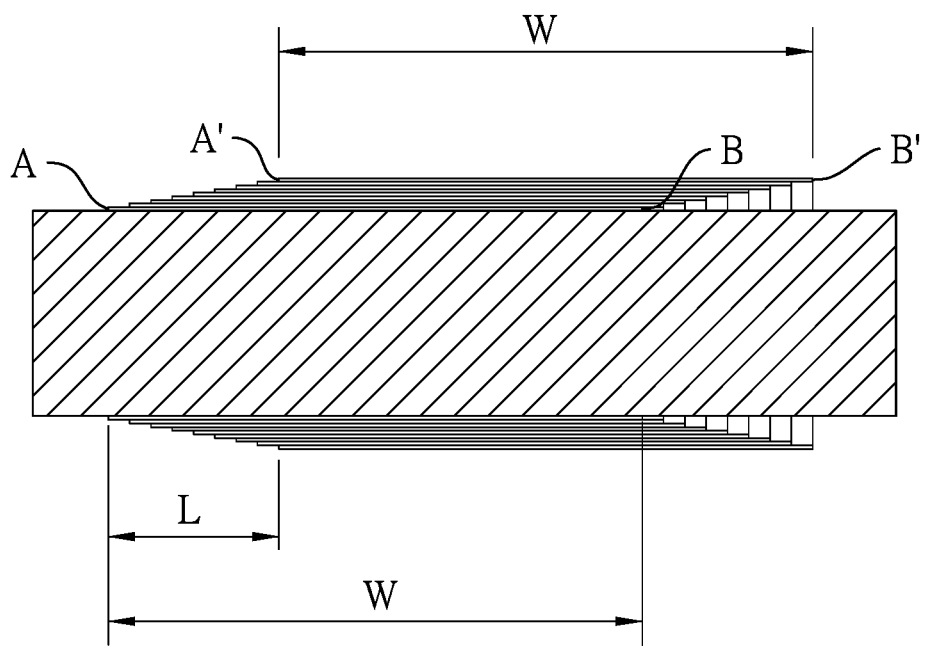
FIG. 3B is a sectional view of FIG. 3A.

Furthermore, from the comparison results of Comparative Examples 1 to 8, the misaligned degrees in Comparative Examples 1, 2, 5, 7 and 8 are higher than the misaligned degrees in Comparative Examples 3 and 6. It demonstrates that the more uniform the thickness of each sub-region of the electrolytic copper foil along the transverse direction is and the more similar the weight of each sub-region of the electrolytic copper foil along the transverse direction is, the misalignment during the winding process is less prone to occur. However, because the electrolytic copper foils of Comparative Examples 3 and 6 do not control the difference in surface roughness between the deposited side and the drum side in the appropriate range, the misalignment still occur (as shown in FIGS. 3A and 3B).

Based on the above experimental results, the instant disclosure can effectively reduce or even avoid incurring the misalignment during the winding process of the electrolytic copper foils by controlling the range of the absolute difference in surface roughness between the opposite sides of the electrolytic copper foils and the range of the relative weight deviation along the width direction of the electrolytic copper foil. Therefore, the instant disclosure can obtain the non-misaligned electrolytic copper foil without cutting off the misaligned part of the electrolytic copper foil in the manufacturing process or improving the manufacturing equipment. Consequently, the aim of increasing the yield of making the electrolytic copper foil and avoiding the increase in production cost can be achieved.

Even though numerous characteristics and advantages of the instant disclosure have been set forth in the foregoing description, together with details of the structure and features of the disclosure, the disclosure is illustrative only. Changes may be made in the details, especially in matters of shape, size, and arrangement of parts within the principles of the disclosure to the full extent indicated by the broad general meaning of the terms in which the appended claims are expressed.

What is claimed is:

1. An electrolytic copper foil comprising:
    a drum side and a deposited side opposite the drum side;
    an absolute value of a difference in surface roughness between the deposited side and the drum side being less than 0.8 μm; and
    wherein the electrolytic copper foil having a transverse direction and a machine direction, wherein when the electrolytic copper foil is divided into 10 test pieces with the same width and the same length along the transverse direction, and when a weight deviation between each two adjacent ones of the 10 test pieces is obtained, there are a total of 9 sets of weight deviations among the 10 test pieces, and then the following conditions are satisfied: (1) a total count of the weight deviation(s) greater than or equal to 1.5% is smaller than a total count of the weight deviations smaller than 1.5%; and (2) at least one of the 9 sets of the weight deviations is greater than 0.00% and equal to or smaller than 2.20%, with the other(s) of the 9 sets of the weight deviation(s) being equal to or greater than 0.00% and equal to or smaller than 2.20%,
    wherein the weight deviation between each two adjacent ones of the 10 test pieces is calculated by the following formula, wherein n represents any one of the test piece numbers from 1 to 9:

$$\text{the weight deviation between each two adjacent ones of the 10 test pieces (\%)} = \frac{|\text{the weight of test piece } (n) - \text{the weight of test piece } (n+1)|}{\text{the smaller weight in test piece } (n) \text{ and test piece } (n+1)} \times 100\%.$$

2. The electrolytic copper foil as claimed in claim 1, wherein the absolute value of the difference in surface roughness between the deposited side and the drum side is equal to or larger than 0.1 μm and equal to or smaller than 0.75 μm.

3. The electrolytic copper foil as claimed in claim 1, wherein the absolute value of the difference in surface roughness between the deposited side and the drum side is equal to zero.

4. The electrolytic copper foil as claimed in claim 1, wherein each of the 9 sets of the weight deviations between each two adjacent ones of the 10 test pieces is greater than 0.00% and equal to or smaller than 2.20%.

5. The electrolytic copper foil as claimed in claim 2, wherein each of the 9 sets of the weight deviations between the each two adjacent ones of the 10 test pieces is greater than 0.00% and equal to or smaller than 2.20%.

6. The electrolytic copper foil as claimed in claim 3, wherein each of the 9 sets of the weight deviations between each two adjacent ones of the 10 test pieces is greater than 0.00% and equal to or smaller than 2.20%.

7. The electrolytic copper foil as claimed in claim 1, wherein a quotient of the count of the weight deviation(s) greater than or equal to 1.5% divided by 9 is smaller than or equal to 0.45.

8. The electrolytic copper foil as claimed in claim 2, wherein a quotient of the count of the weight deviation(s) greater than or equal to 1.5% divided by 9 is smaller than or equal to 0.45.

9. The electrolytic copper foil as claimed in claim 3, wherein a quotient of the count of the weight deviation(s) greater than or equal to 1.5% divided by 9 is smaller than or equal to 0.45.

10. The electrolytic copper foil as claimed in claim 4, wherein a quotient of the count of the weight deviation(s) greater than or equal to 1.5% divided by 9 is smaller than or equal to 0.45.

11. The electrolytic copper foil as claimed in claim 1, wherein the transverse direction of the electrolytic copper foil is perpendicular to the machine direction of the electrolytic copper foil.

* * * * *